United States Patent [15] 3,670,394
Daniels et al. [45] June 20, 1972

[54] METHOD OF CONNECTING METAL CONTACT AREAS OF ELECTRIC COMPONENTS TO METAL CONDUCTORS OF FLEXIBLE SUBSTRATE

[72] Inventors: Hendricus Petrus Cornelis Daniels; Theodorus Johannes Van Der Ven; Hans Gerard Karel Tates, all of Emmasingel, Eindhoven, Netherlands

[73] Assignee: U.S. Philips Corporation, New York, N.Y.

[22] Filed: Nov. 3, 1970

[21] Appl. No.: 86,472

[30] Foreign Application Priority Data

Nov. 13, 1969 Netherlands..........................6917128

[52] U.S. Cl...........................29/470.1, 29/471.1, 29/497.5, 228/1, 269/53

[51] Int. Cl...........................B23k 21/00

[58] Field of Search..............29/470.1, 471.1, 497.5, 471.3; 228/1; 269/53, 54; 156/73

[56] References Cited

UNITED STATES PATENTS

| | | | |
|---|---|---|---|
| 1,806,887 | 5/1931 | Bruno | 269/53 |
| 2,922,554 | 1/1960 | Zauncosky et al. | 269/53 X |
| 2,926,906 | 3/1960 | Hawkins | 269/53 X |
| 3,047,942 | 8/1962 | Schneider et al. | 29/497.5 |
| 3,561,107 | 2/1971 | Best et al. | 29/470.1 X |
| 3,589,000 | 6/1971 | Galli | 29/471.1 X |

*Primary Examiner*—John F. Campbell
*Assistant Examiner*—Richard Bernard Lazarus
*Attorney*—Frank R. Trifari

[57] ABSTRACT

The metal contact areas of electric components, for example, semiconductor bodies, are connected to metal conductors of a flexible substrate by orienting the contact areas relative to the conductors, pressing the contact areas and the conductors against each other, temporarily reinforcing the flexible substrate by causing projections of a pressure member to penetrate into the foil as a result of ultrasonic vibrations, and subsequently ultrasonically welding the contact areas to the conductors of the flexible substrate.

5 Claims, 7 Drawing Figures

INVENTORS.
HENRICUS P. C. DANIELS
THEODORUS J. VAN DER VEN
BY HANS G. K. TATES

AGENT

INVENTORS
HENRICUS P.C. DANIELS
THEODORUS J. VAN DER VEN
HANS G. K. TATES
BY
Frank R. Trifari
AGENT

METHOD OF CONNECTING METAL CONTACT AREAS OF ELECTRIC COMPONENTS TO METAL CONDUCTORS OF FLEXIBLE SUBSTRATE

The invention relates to a method of connecting metal contact areas of electric components, for example, semiconductor bodies, to metal conductors of a flexible substrate, for example, a foil of a synthetic resin. The electric components may consist, for example, of semiconductor bodies, of resistors, such as thin film of thick film resistors, of capacitors, of coils but also, for example, of strain gauges.

The connection of contact areas of semiconductor bodies, for example, transistors or integrated circuits, to conductors which are provided on a rigid substrate is known per se. In this case, after pressing the substrate and the crystal against each other a connection may be obtained, for example, a thermocompression bonding or a soldered joint, by adding thermal energy. It may also be tried to obtain the joint by means of an ultrasonic welding device. However, this will often present difficulties since the upper side of the contact areas on the semiconductor body must then be located substantially in a flat plane and the pressure between the various conductors and the contact areas may show only small deviations. If the semiconductor crystal is to be provided ultrasonically on conductors of a flexible and supple substrate, the difficulties become even greater since the vibration energy of the welding device is also absorbed in said flexible substrate.

It is the object of the invention to provide a method by means of which metal conductors of flexible foils can very efficaciously be connected to metal contact areas on an electric substrate, for example, a semiconductor body, by means of ultrasonic vibration. For that purpose, the method according to the invention is characterized in that the electric component is oriented relative to the flexible substrate in such manner that the contact areas are situated opposite to the cooperating conductors that the conductors of the flexible substrate and the contact areas of the electric components are pressed against each other between pressure members, the pressure member for the flexible substrate comprising a homogeneous pattern of projections, that one of the two pressure members is then ultrasonically vibrated as a result of which the projections pressing against the flexible substrate penetrate into said substrate so that the foil at that area is temporarily re-inforced, after which, as a result of the ultrasonic vibration, the contact areas and the conductors rub over each other and are welded together.

The flexible substrate is temporarily considerably reinforced by the penetrating projections at the area of the welds to be formed. The vibration absorption in the foil is for the greater part removed by it. Furthermore, the penetrating projections ensure that during the ultrasonic vibration the foil does not slip relative to the pressure member. Near the contact areas the foil still retains some elasticity and thus will be adjusted in such a way that the conductors on the foil all press against the cooperating contact areas on the semiconductor body with approximately equal force. Consequently, the mutual height of the contact areas is now considerably less critical than in the case of a connection to a rigid substrate.

Prior to orienting the flexible substrate relative to the electric component, it may be forced against the pressure member which is provided with a homogeneous pattern of projection, the projections penetrating already at least partly into the substrate.

In a preferred embodiment of the method according to the invention the projections are arranged at such a pitch that at least three projections are always situated opposite to a contact area.

A very favorable operation is obtained if the projections are formed as pyramids the bases of which are lying against to each other or at some distance from each other.

In order that the invention may be readily carried into effect, embodiments thereof will now be described in greater detail, by way of example, with reference to the accompanying drawings, in which FIG. 1 shows a part of a foil of a synthetic resin with conductors and a crystal to be secured thereto.

Figure 1:
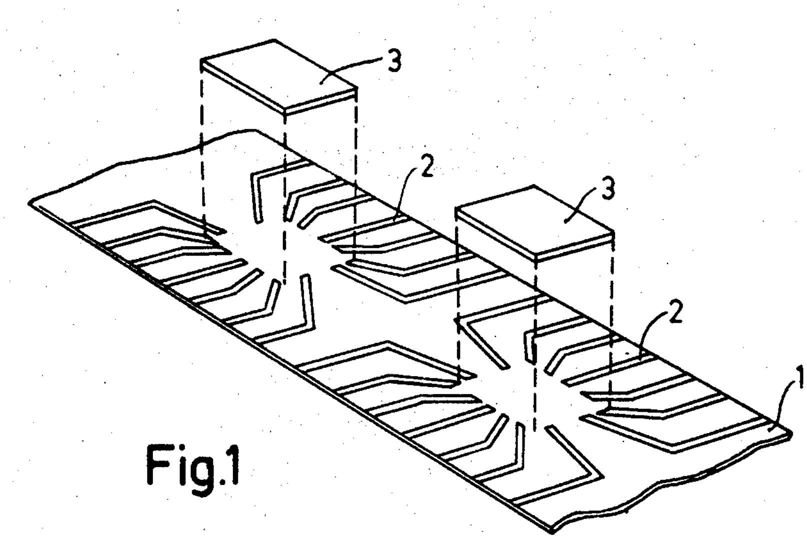
Figure 3:
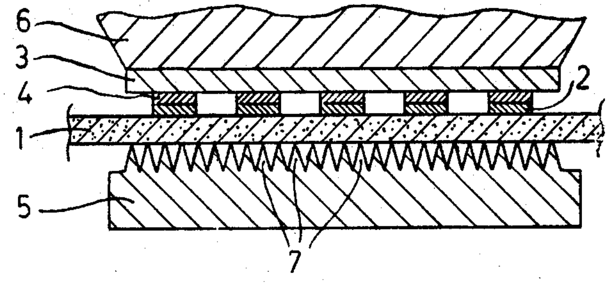
FIG. 3 shows the crystal placed against the foil in which the assembly is held between two pressure members.
Figure 4:
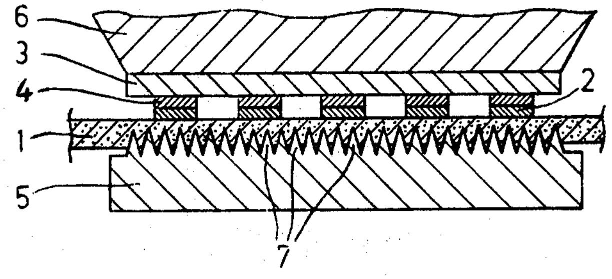
FIG. 4 shows the situation in which the projections have penetrated into the foil.

FIG. 1 shows an elongate foil 1 which may consist of a synthetic resin, for example, a polyimide foil, but which can also consist, for example, of paper. The thickness of the foil is, for example, approximately 25 $\mu$. A pattern of metal conductors 2 is present on said flexible foil. A semiconductor crystal 3, for example, an integrated circuit, comprises metal contact areas 4 (see FIGS. 2 to 4). The contact areas 3 are to be connected to the metal conductors 2.

Figure 2:
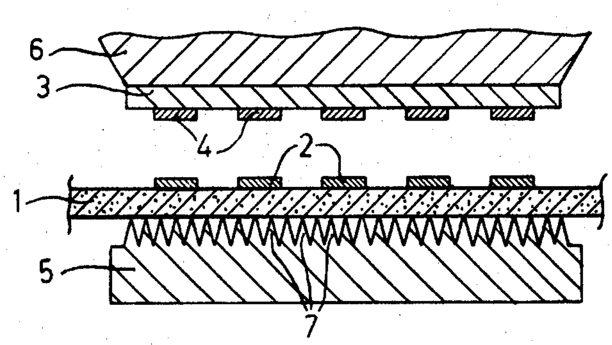
FIG. 2 shows the foil and the crystal at some distance from each other, and situated against a pressure member.

FIG. 2 shows the foil with the contact areas 4 of the semiconductor body oriented relative to the conductors 2, in which the flexible foil at the area of the components to be connected is laid first on a pressure member in the form of an anvil 5. A second pressure member, the sonotrode 6 of an ultrasonic welding device, holds the crystal 3 by its surface remote from the contact areas 4. The pressure members 5 and 6 are now pressed to each other (FIG. 3) and an ultrasonic generator is actuated as a result of which the sonotrode 6 starts vibrating. In the first instance the occurring vibration is absorbed for a considerable part by the flexible foil. As a result of the vibration, the projections 7 present on the anvil 5 will penetrate into the foil (FIG. 4) so that at that area the flexible foil is temporarily reinforced. As a result of this the absorption of the vibrations in the foil is minimized and the most important part of the power supplied by the ultrasonic welding device will be available for welding. The conductors 2 on the foil are also pressed against corresponding contact areas 4 on the semiconductor body, the force on the various contact areas being substantially equal in spite of any differences in height of the said contact places, since the depth of penetration of the projections can adapt automatically. Since the projections penetrating into the foil obtain a good grip on the foil, so that no slip occurs, the contact areas as a result of the vibration will rub over the conductors, so that an ultrasonic weld can be obtained.

It will be obvious that the above-described operation can also be obtained if the sonotrode is provided with the projections, in which case the semiconductor element is present on the anvil and the foil is held by the sonotrode.

The flexible foil can already be partly reinforced prior to being oriented relative to the crystal. For that purpose, the foil may be placed on the anvil which comprises projections after which a pressure is exerted on the foil in such manner that the projections penetrate already partly into the foil.

Figure 5:
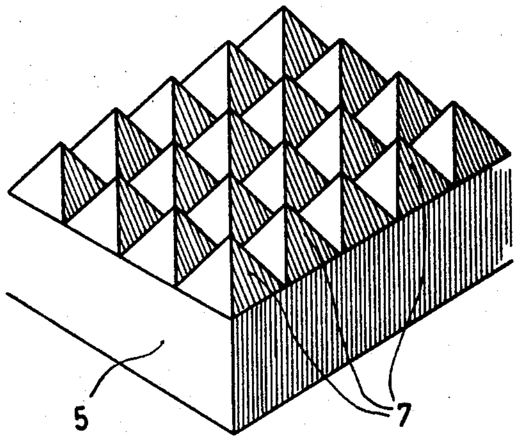
FIGS. 5, 6, and 7 show embodiments of members comprising sharp projections.

FIG. 5 shows an example of the pressure member 5 having sharp projections. In this case the projections 7 are regularly provided in the form of pyramids. The height of the projections is approximately 25 $\mu m$ in this example. The projections 7 will penetrate at least 10 $\mu$ into a foil of a synthetic resin having a thickness of 25 $\mu$. The apex of the projections in this example is 60° but it may also lie between 20° and 100°. The pitch between the projections must be so that at least three projections are present opposite to a contact area 4, since otherwise the pressure occurring between the contact areas 4 and the conductors 2, will not be evenly distributed between the contact surface. In the example shown in FIG. 5, the pitch is nearly 30 $\mu m$.

Figure 6:
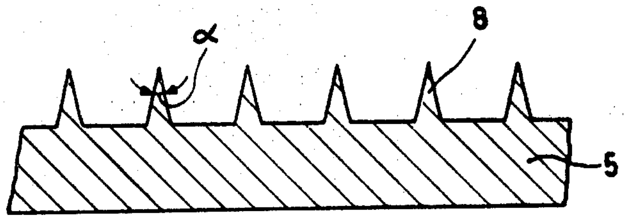

In FIG. 6 the projections 8 are also pyramidal but the bases are situated at some distance from each other. With the same pitch as the projections 7 of FIG. 5, the apex of the projections 8 will be smaller in FIG. 6. A particularly favorable effect is obtained in this case with projections having an apex $\alpha$ of 20° to 30° and, with a height of 25 $\mu m$, have a pitch of 40 $\mu m$.

Figure 7:
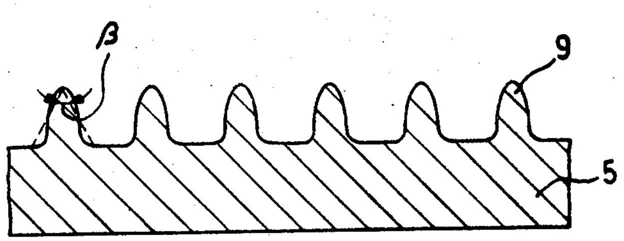

The projections may also be shaped differently. As is shown in FIG. 7, the projections 9 may be given, for example, a slightly bell.like variation. The angle $\beta$ between the apex of said bell-like part and the lowest part again is preferably between 20° and 100°.

In the figures the projections are shown as forming part of the sonotrode or the anvil. It is of course alternatively possible to provide the projections in, for example, a plate-shaped body and to secure said body to the sonotrode or to the anvil.

What is claimed is:

1. A method of connecting metal contact areas of electric components to metal conductors of a flexible substrate wherein the electric component is oriented relative to the flexible substrate in such manner that the contact areas are situated opposite to the cooperating conductors, the conductors of the flexible substrate and the contact areas of the electric components are pressed against each other between pressure members, the pressure member for the flexible substrate comprising a homogeneous pattern of projections, one of the two pressure members is then vibrated ultrasonically as a result of which the projections pressing against the flexible substrate penetrate into said substrate, so that the foil at that area is temporarily reinforced, after which, as a result of the ultrasonic vibration, the contact areas and the conductors rub over each other and are welded together.

2. A method as claimed in claim 1, characterized in that prior to orienting the flexible substrate relative to the electric component, the flexible substrate is pressed against the pressure member which is provided with a homogeneous pattern of projections, the projections penetrating at least already partly into the substrate.

3. A method as claimed in claim 1, characterized in that the projections are provided at such a pitch that at least three projections are always present opposite to a contact area.

4. A method as claimed in claim 2, characterized in that the projections are formed as pyramids the bases of which are situated against each other.

5. A method as claimed in claim 2, characterized in that the projections are formed as pyramids, the bases of which are situated at some distance from each other.

* * * * *